(12) United States Patent
Breymesser et al.

(10) Patent No.: US 9,570,542 B2
(45) Date of Patent: Feb. 14, 2017

(54) SEMICONDUCTOR DEVICE INCLUDING A VERTICAL EDGE TERMINATION STRUCTURE AND METHOD OF MANUFACTURING

(71) Applicant: Infineon Technologies AG, Neubiberg (DE)

(72) Inventors: Alexander Breymesser, Villach (AT); Andre Brockmeier, Villach (AT); Elmar Falck, Hohenbrunn (DE); Francisco Javier Santos Rodriguez, Villach (AT); Holger Schulze, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/242,366

(22) Filed: Apr. 1, 2014

(65) Prior Publication Data

US 2015/0279930 A1    Oct. 1, 2015

(51) Int. Cl.
| | |
|---|---|
| *H01L 29/06* | (2006.01) |
| *H01L 29/32* | (2006.01) |
| *H01L 29/40* | (2006.01) |
| *H01L 29/66* | (2006.01) |
| *H01L 29/739* | (2006.01) |

(Continued)

(52) U.S. Cl.
CPC ..... *H01L 29/0615* (2013.01); *H01L 21/76224* (2013.01); *H01L 29/0649* (2013.01); *H01L 29/0661* (2013.01); *H01L 29/32* (2013.01); *H01L 29/402* (2013.01); *H01L 29/66136* (2013.01); *H01L 29/7395* (2013.01); *H01L 29/8611* (2013.01); *H01L 29/8613* (2013.01);

(Continued)

(58) Field of Classification Search
CPC .................................................. H01L 29/66136
See application file for complete search history.

(56) References Cited

U.S. PATENT DOCUMENTS

| 5,773,874 A | 6/1998 | Eithoven | |
|---|---|---|---|
| 5,910,680 A * | 6/1999 | Maniar | ................. H01L 21/316 257/644 |

(Continued)

FOREIGN PATENT DOCUMENTS

| DE | 10057612 A1 | 5/2002 |
|---|---|---|
| DE | 102005038152 A1 | 3/2006 |
| DE | 102006009961 A1 | 10/2006 |

OTHER PUBLICATIONS

Wolf and Tauber, Silicon Processing for the VLSI Era, vol. 1: Process Technology, 2nd ed. Lattice Press: Sunset Beach CA, 2000, pp. 198-201.*

(Continued)

*Primary Examiner* — Erik Kielin
(74) *Attorney, Agent, or Firm* — Murphy, Bilak & Homiller, PLLC

(57) ABSTRACT

A semiconductor device includes a semiconductor body with a first surface at a first side, a second surface opposite to the first surface and an edge surface connecting the first and second surfaces. An edge termination structure includes a glass structure and extends along the edge surface, at least from a plane coplanar with the first surface towards the second surface. A conductive structure extends parallel to the first surface and overlaps the glass structure at the first side.

15 Claims, 14 Drawing Sheets

(51) Int. Cl.
*H01L 29/861* (2006.01)
*H01L 21/762* (2006.01)
*H01L 29/16* (2006.01)
*H01L 29/20* (2006.01)
*H01L 29/22* (2006.01)

(52) U.S. Cl.
CPC ............ *H01L 29/1608* (2013.01); *H01L 29/20* (2013.01); *H01L 29/2203* (2013.01)

(56) References Cited

U.S. PATENT DOCUMENTS

| | | | |
|---|---|---|---|
| 6,013,579 A * | 1/2000 | Wang | H01L 21/76802 257/E21.577 |
| 6,396,090 B1 | 5/2002 | Hsu et al. | |
| 6,696,705 B1 | 2/2004 | Barthelmess et al. | |
| 8,264,047 B2 | 9/2012 | Schmidt | |
| 8,294,235 B2 | 10/2012 | Zeng et al. | |
| 8,304,329 B2 | 11/2012 | Zeng et al. | |
| 8,912,621 B1 * | 12/2014 | Chuang | H01L 29/872 257/471 |
| 2006/0038206 A1 * | 2/2006 | Shimoyama | H01L 21/6835 257/273 |
| 2009/0179298 A1 * | 7/2009 | Cheng | 257/506 |
| 2009/0242978 A1 | 10/2009 | Kocon | |
| 2010/0219468 A1 * | 9/2010 | Zeng | H01L 29/0634 257/330 |
| 2011/0006403 A1 * | 1/2011 | Okumura | H01L 21/76224 257/620 |
| 2012/0104537 A1 * | 5/2012 | Schmidt | H01L 29/0638 257/476 |
| 2012/0306044 A1 | 12/2012 | Bobde et al. | |
| 2012/0306046 A1 | 12/2012 | Schmidt | |
| 2013/0234297 A1 | 9/2013 | Breymesser et al. | |
| 2013/0237034 A1 | 9/2013 | Breymesser et al. | |
| 2014/0167143 A1 * | 6/2014 | Schmidt | H01L 21/26586 257/329 |
| 2015/0076600 A1 * | 3/2015 | Jun | H01L 21/265 257/339 |
| 2015/0303097 A1 * | 10/2015 | Konishi | H01L 21/02164 257/506 |

OTHER PUBLICATIONS

Breymesser, Alexander, "Semiconductor Devices and Methods for Manufacturing Semiconductor Devices", U.S. Appl. No. 13/661,923, filed Oct. 26, 2012.

Kotb, et al., "Feasibility Study of a Junction Termination Using Deep Trench Isolation Technique for the Realization of DT-SJMOSFETS", Proceedings of the 20th International Symposium on Power Semiconductor Devices and IC's, May 18-22, 2008, Orlando, Florida, pp. 303-306.

Seto, et al., "Universal Trench Edge Termination Design", Proceedings of the 2012 24th International Symposium on Power Semiconductor Devices and ICs, Jun. 3-7, 2012, Bruges, Belgium, pp. 161-164.

Theolier, et al., "A New Junction Termination Technique: the Deep Trench Termination (DT2)", Institute of Electrical and Electronics Engineers, 2009, pp. 176-179.

Vladimirova, et al., "The Vertical Voltage Termination Technique—Characterizations of Single Die Multiple 600V Power Devices", Proceedings of the 23rd International Symposium on Power Semiconductor Devices and IC's, May 23-26, 2011, San Diego, California, pp. 204-207.

Von Koblinski, Carsten, "A Chip Package and a Method for Manufacturing a Chip Package", U.S. Appl. No. 13/555,248, filed Jul. 23, 2012.

* cited by examiner

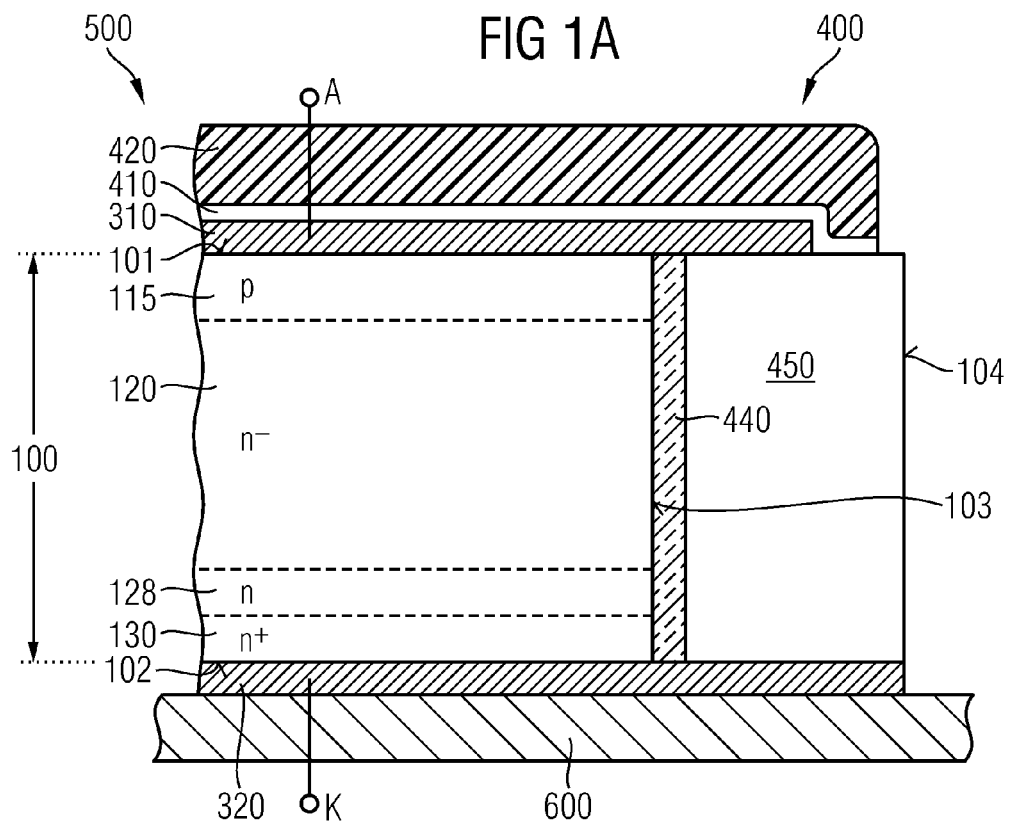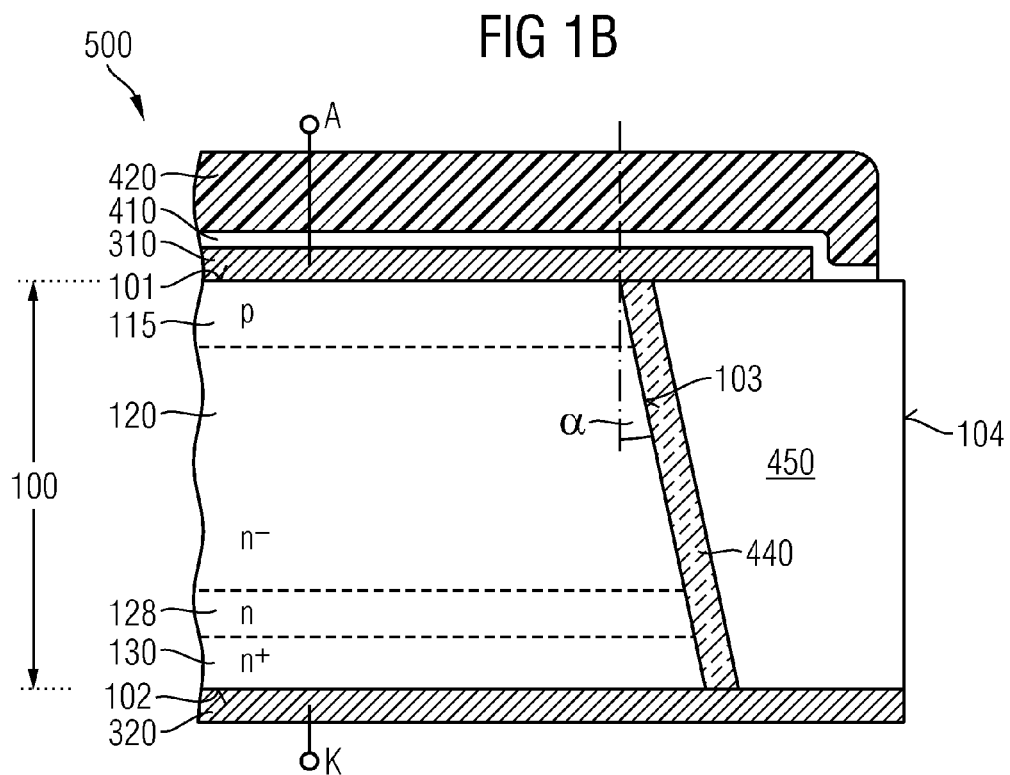

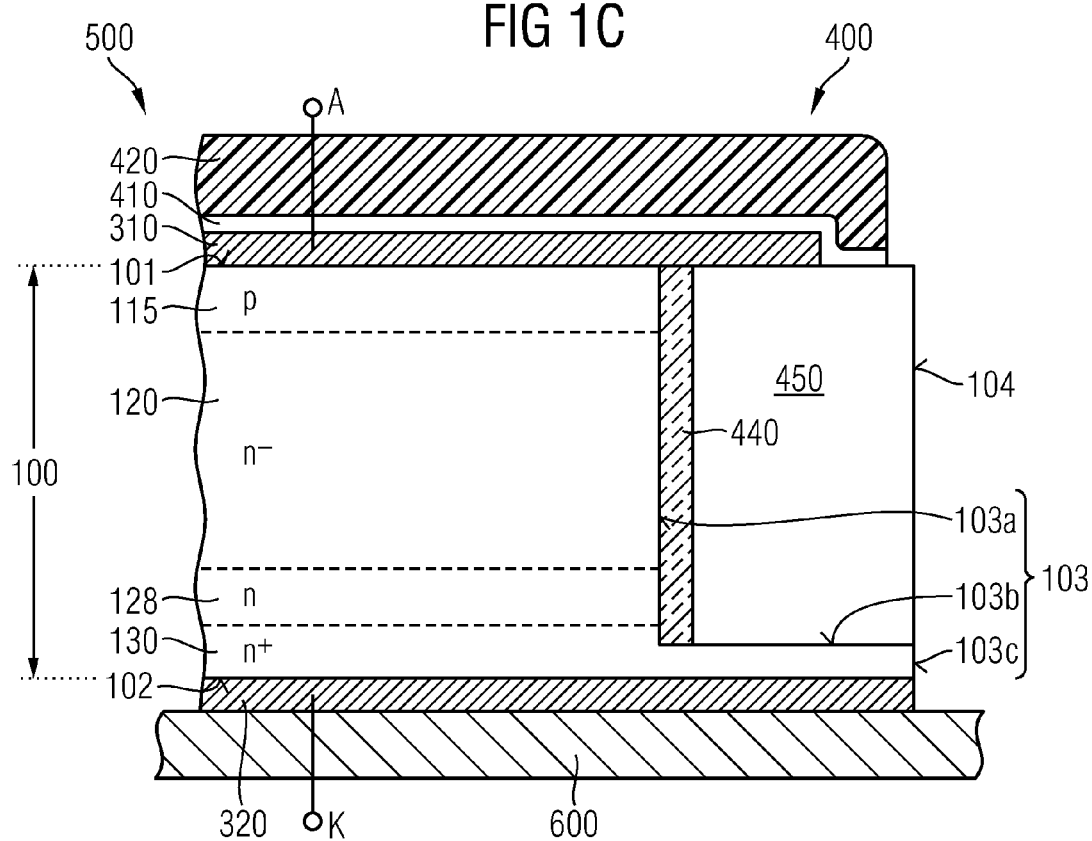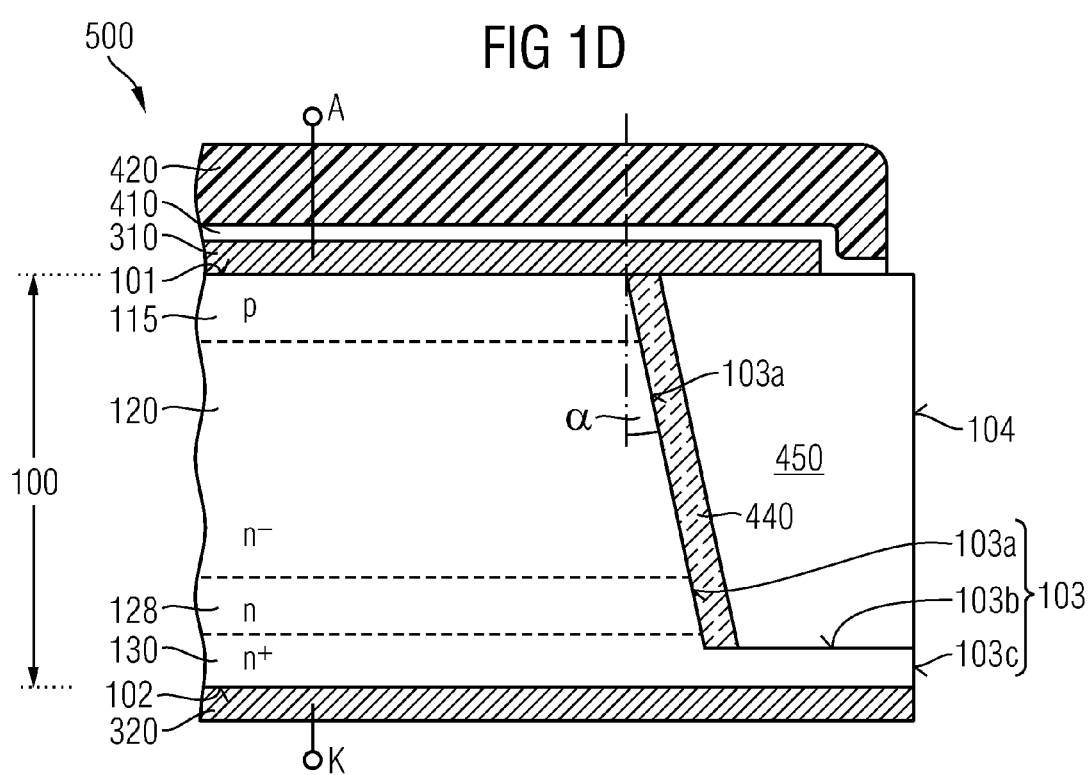

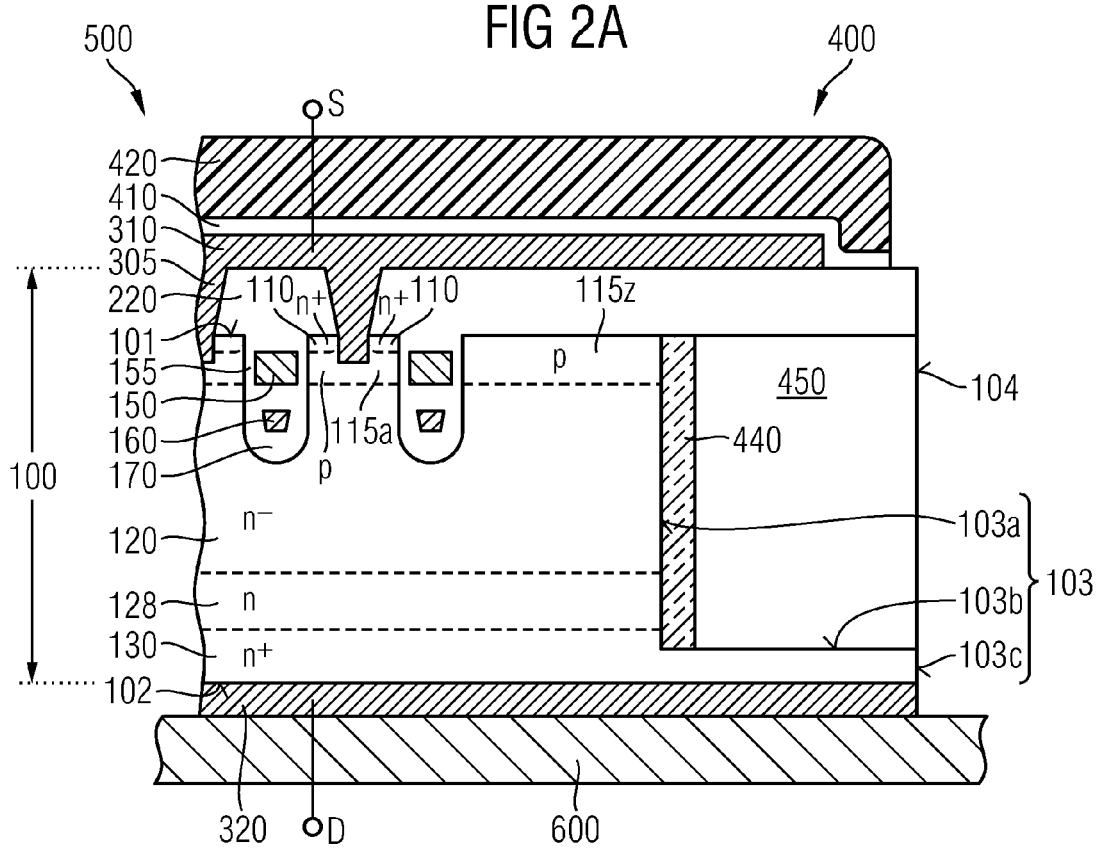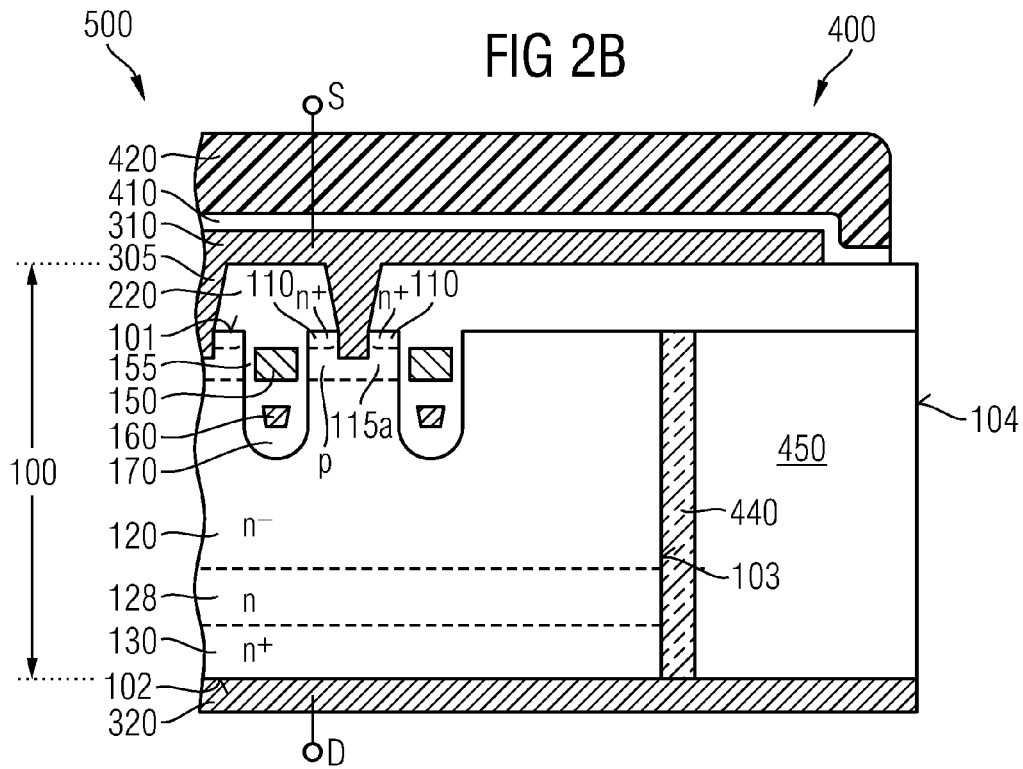

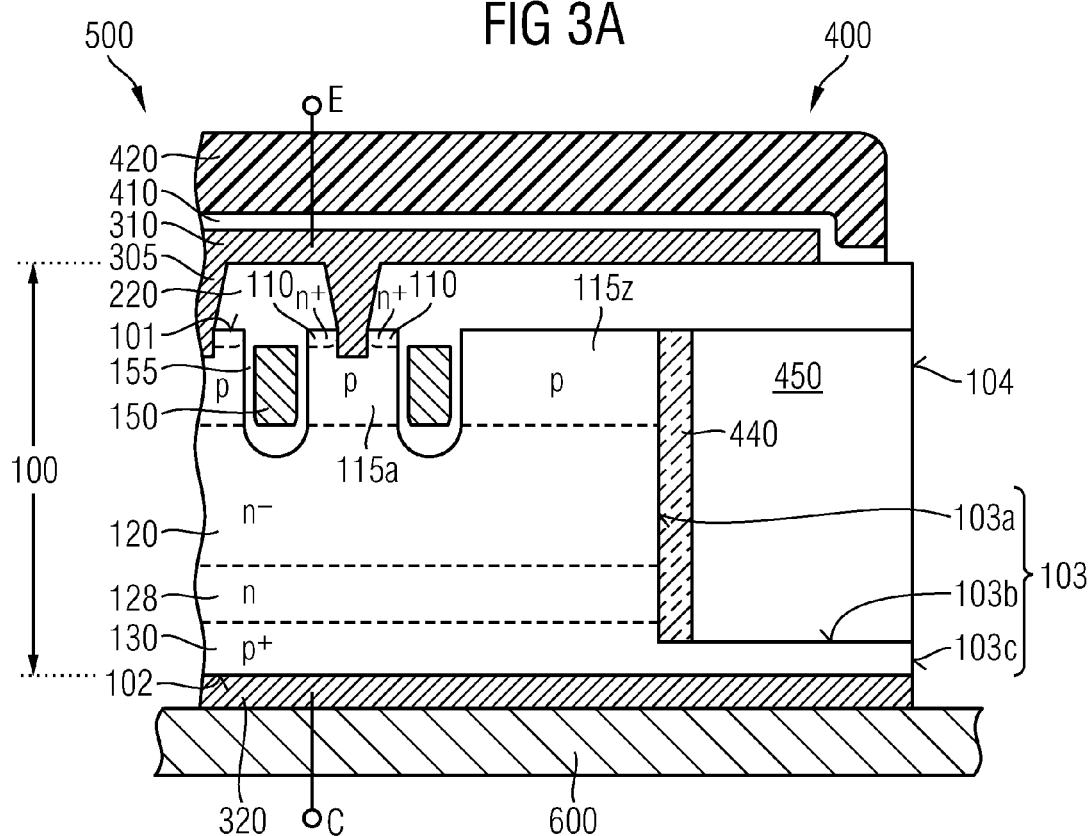
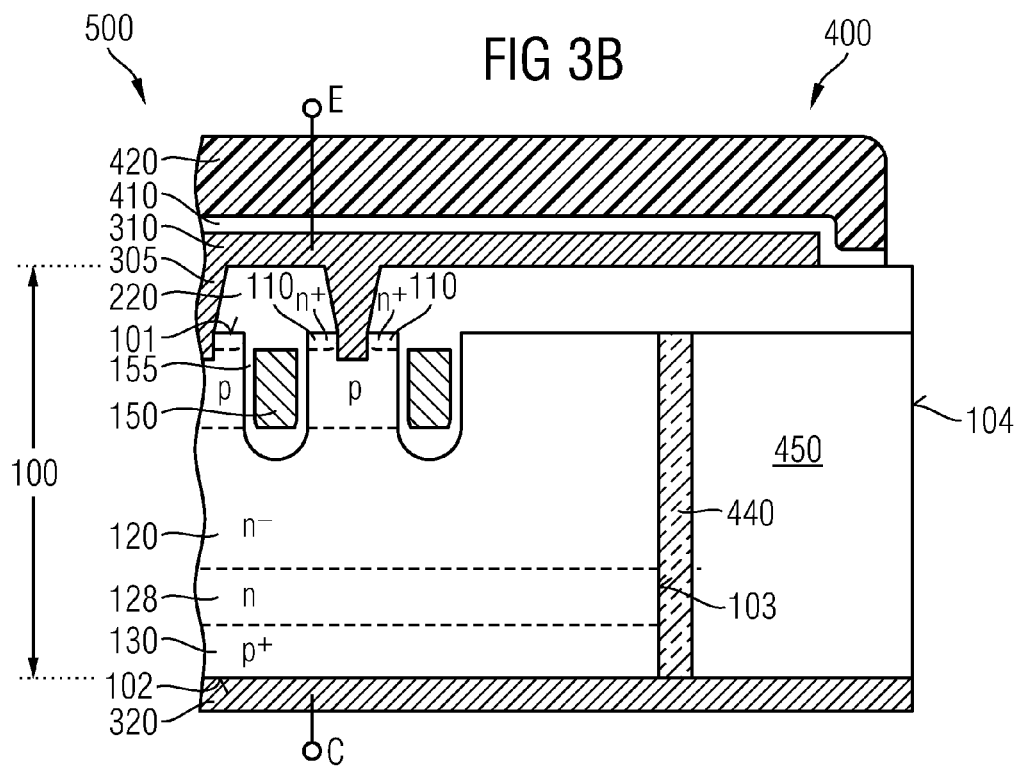

SEMICONDUCTOR DEVICE INCLUDING A VERTICAL EDGE TERMINATION STRUCTURE AND METHOD OF MANUFACTURING

BACKGROUND

In power semiconductor devices edge termination structures along the outer edge of a semiconductor die are vitally important for achieving a high blocking capability. In the blocking mode vertical edge termination structures support the blocking voltage along a vertical direction of the semiconductor die, wherein the electric field lines run along the vertical direction and the equipotential lines run approximately parallel to the main surfaces of the semiconductor die. There is a need for improved vertical edge termination structures.

SUMMARY

An embodiment refers to a semiconductor device that includes a semiconductor body with a first surface at a first side, a second surface opposite to the first surface and an edge surface connecting the first and second surfaces. An edge termination structure includes a glass structure and extends along the edge surface at least from a plane coplanar with the first surface towards the second surface. A conductive structure extends parallel to the first surface and overlaps the glass structure at the first side.

Another embodiment refers to a method of manufacturing a semiconductor device. A frame trench is formed that extends from a first surface into a semiconductor substrate. The frame trench is filled with an edge termination structure including a glass structure. A conductive layer is formed on the semiconductor substrate and the edge termination structure. A portion of the conductive layer above the edge termination structure is removed, wherein a remnant portion of the conductive layer covers a portion of the edge termination structure directly adjoining a sidewall of the frame trench.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIG. 1A is a schematic cross-sectional view of a portion of a semiconductor device including an edge termination structure according to an embodiment related to semiconductor diodes with vertical semiconductor edge surface.

FIG. 1B is a schematic cross-sectional view of a portion of a semiconductor device in accordance with an embodiment related to semiconductor diodes with slanting semiconductor edge surface.

FIG. 1C is a schematic cross-sectional view of a portion of a semiconductor device in accordance with an embodiment related to semiconductor diodes with stepped semiconductor edge surface.

FIG. 1D is a schematic cross-sectional view of a portion of a semiconductor device in accordance with an embodiment related to semiconductor diodes with stepped semiconductor edge surface including a slanted portion.

FIG. 2A is a schematic cross-sectional view of a portion of a semiconductor device including an edge termination structure according to an embodiment related to IGFETs (insulated gate field effect transistors) with stepped semiconductor edge surface.

FIG. 2B is a schematic cross-sectional view of a portion of a semiconductor device in accordance with an embodiment related to IGFETs with vertical semiconductor edge surface.

FIG. 3A is a schematic cross-sectional view of a portion of a semiconductor device including an edge termination structure according to an embodiment related to IGBTs (insulated gate bipolar transistor) with stepped semiconductor edge surface.

FIG. 3B is a schematic cross-sectional view of a portion of a semiconductor device in accordance with an embodiment related to IGBTs with vertical semiconductor edge surface.

DETAILED DESCRIPTION

Figure 4A:
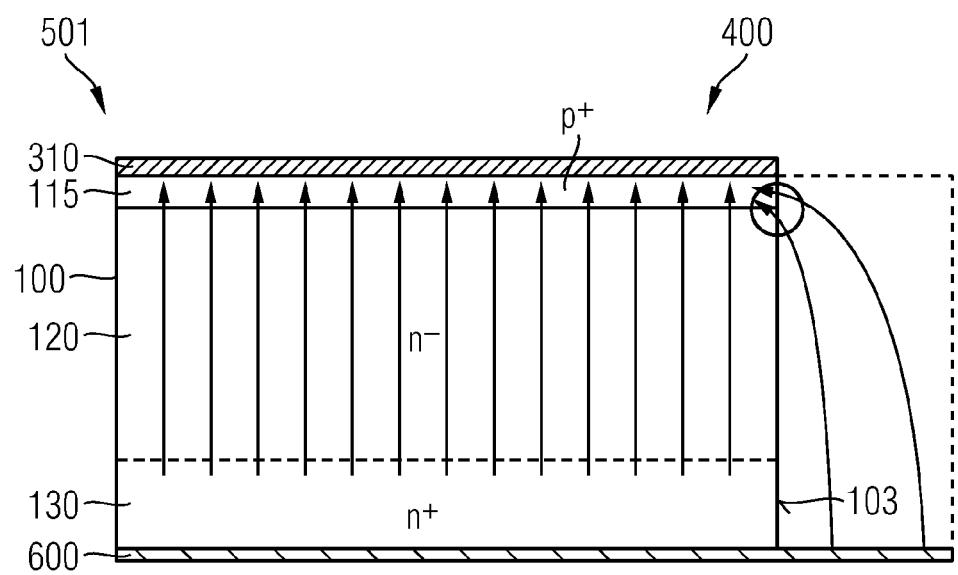
FIG. 4A is a schematic cross-sectional view of a semiconductor device for illustrating effects of the embodiments.

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may be provided between the electrically coupled elements, for example elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

The semiconductor device 500 of FIG. 1A may be a semiconductor diode with a semiconductor body 100 provided from a single-crystalline semiconductor material, for example silicon (Si), silicon carbide (SiC), germanium (Ge), a silicon germanium crystal (SiGe), gallium nitride (GaN) or gallium arsenide (GaAs), by way of example.

A distance between a planar first surface 101 of the semiconductor body 100 at a first side and a planar second surface 102 parallel to the first surface 101 at an opposite second side may be at least 20 µm, for example, at least 150 µm and may reach several hundred µm. A perpendicular to the first surface 101 defines a vertical direction and directions orthogonal to the vertical direction are lateral directions.

The semiconductor body 100 includes a drift zone 120 of a first conductivity type and an anode region 115 of a second conductivity type, which is complementary to the first conductivity type. A mean impurity concentration in the drift zone 120 may be between $5 \times 10^{12}$ (5E12) cm$^{-3}$ and $5 \times 10^{14}$ (5E14) cm$^{-3}$, by way of example. The anode region 115 and the drift zone 120 form a pn junction parallel to the first surface 101.

A heavily doped pedestal region 130 of the first conductivity type and arranged between the drift zone 120 and the second surface 102 is effective as a cathode region. The pedestal region 130 may be a continuous layer of the first or the second conductivity type, wherein the impurity concentration in the pedestal region 130 may be at least $5 \times 10^{17}$ (5E17) cm$^{-3}$, e.g., at least $5 \times 10^{18}$ (5E18) cm$^{-3}$ to ensure an ohmic contact between the pedestal region 130 and a metallization directly adjoining the second surface 102. According to other embodiments, the pedestal region 130 may include heavily doped first zones of the first conductivity type and heavily doped second zones of the second conductivity type.

Between the drift zone 120 and the pedestal region 130 the semiconductor body 100 may include a field stop layer 128 with an impurity concentration at least ten times as high as the impurity concentration in the drift zone 120 and at most a tenth of the impurity concentration in the pedestal region 130. The field stop layer 128 may include two or more sub layers, wherein in each sub layer the vertical impurity concentration profile may have a local maximum.

In the blocking mode of the semiconductor diode a depletion zone extending from the pn junction into the direction of the second surface 102 extends at most up to a unipolar homojunction, e.g. a pp$^+$ or nn$^+$ junction, between the field stop layer 128 and the pedestal region 130. As a consequence, at least up to the nominal breakdown voltage of the semiconductor device 500 the pedestal region 130 is devoid of an electric field.

An edge surface 103, which may be straight or stepped, connects the first and the second surfaces 101, 102. A slope angle α of the edge surface 103 with respect to a normal to the first surface 101 may be between −60 and +60 degree, wherein the semiconductor body 100 tapers from the second 102 to the first surface 101. According to the illustrated embodiment, the edge surface 103 is straight and approximately vertical.

An edge termination structure 400 including a glass structure 450 directly adjoins at least a portion of the edge surface 103. The edge termination structure 400 may include an optional auxiliary structure 440 extending from the first surface 101 towards the second surface 102. The auxiliary structure 440 may separate at least the anode region 115 and the drift zone 120 from the glass structure 450. According to the illustrated embodiment the auxiliary structure 440 also separates the field stop layer 128 and the pedestal region 130 from the glass structure 450.

The auxiliary structure 440 may be a homogeneous structure or may include two or more auxiliary layers with vertical interfaces. For example, the auxiliary structure 440 may include a first and a second auxiliary layer. One of the auxiliary layers may provide a moisture passivation and another auxiliary layer may be effective as a gettering layer and/or as an adhesive layer. The auxiliary layers may be conformally deposited and may have uniform thickness, respectively. One of the auxiliary layers may be a silicon nitride layer having a thickness of at least 10 nm. Another auxiliary layer may be a BPSG (boron phosphorus silicate glass) layer having a thickness of at least 10 nm. Other embodiments of the auxiliary layers include doped and undoped silicon oxide layers, carbon layers, diamond-like carbon layers, aluminum oxide layers, high-k dielectric layers, and low-k dielectric layers.

The glass structure 450 may result from a glass molding process using a source material like, e.g. soda-lime glass, undoped silica, or silica containing at least one dopant selected from a group comprising boron, sodium, calcium, potassium, and aluminum. According to an embodiment, the glass structure 450 may be bonded to the semiconductor body 100 along an interface with the pedestal structure 130. The edge termination structure 400 may fill a step formed in the stepped edge surface 103 completely and without voids.

A first load electrode 310 is arranged at a first side facing the first surface 101 and directly adjoins the first surface 101, a face surface of the auxiliary structure 440 parallel to the first surface 101 and at least a portion of the glass structure 450 directly adjoining the auxiliary structure 440. According to an embodiment, an overlap between the first load electrode 310 and the edge termination structure 400 is at least 1% of the vertical extension of the semiconductor body 100, for example at least 5% or 10%.

A second load electrode 320 directly adjoins the second surface 102. In the illustrated embodiment the first load electrode 310 forms an anode electrode which may form or which may be electrically connected or coupled to an anode terminal A of the semiconductor device 500. The second load electrode 320 forms a cathode electrode that may be electrically connected or coupled to a cathode terminal K.

Each of the first and second load electrodes 310, 320 may consist of or contain, as main constituent(s) heavily doped polycrystalline silicon, molybdenum (Mo), aluminum (Al), copper (Cu) or alloys of aluminum or copper, for example AlSi, AlCu or AlSiCu. According to other embodiments, at least one of the first and second load electrodes 310, 320 may contain, as main constituent(s), nickel (Ni), vanadium (V), molybdenum (Mo), titanium (Ti), tungsten (W), silver (Ag), gold (Au), platinum (Pt), and/or palladium (Pd). For example, at least one of the first and second load electrodes 310, 320 may include two or more sub-layers, wherein each sub-layer contains one or more of Ni, V, Mo, Ti, Ag, Au, Pt, W, and Pd as main constituent(s), e.g. a silicide, a nitride and/or an alloy.

A passivation layer 410 may cover the first load electrode 310 such that the first load electrode 310 is embedded between the passivation layer 410, the semiconductor body 100 and the edge termination structure 400. The passivation layer 410 may be a homogeneous layer or may include two or more sub-layers of different materials. According to an embodiment the passivation layer 410 consists of or includes hard dielectric layers, e.g., a silicon oxide layer, a silicon nitride layer and/or a silicon oxynitride layer.

A protection layer 420 may completely cover the passivation layer 410. The protection layer 420 and the edge termination structure 400 may form an outward step such that the protection layer 420 does not reach an outer surface 104 of the edge termination structure 400. The material of the protection layer 420 may be a dielectric material having a smaller Young's modulus than the material of the passivation layer 410. According to an embodiment, the dielectric material of the protection layer 420 may be a polymer, for example polyimide, benzocyclobutene, polynorbornene, polystyrene, polycarbonate, parylene, epoxy resin, polybenzoxazole or a mixture therefrom.

The semiconductor device 500 may be mounted on a support component 600, e.g., a conductive lead frame, a DBC (direct bonded copper) or a PCB (printed circuit board). For example, the second load electrode 320 may be soldered or glued onto a surface of the support component 600. At least one of the conductive structures connected to the second surface 102, e.g., the second load electrode 320 or the support component 600 may project beyond the edge surface 103 of the semiconductor body 100. The edge termination structure 400 supports an additional electric field component between the first and second load electrodes 310, 320 outside the semiconductor body 100 resulting from the projecting portions of the second load electrode 320 and/or the support component 600 and prevents a critical field enhancement at an outer edge of the anode region 115.

The vertical extension of the edge termination structure 400 is at least 20 μm, for example at least 50 μm or at least 100 μm. A lateral width of the edge termination structure 400 is at least 2 μm, for example at least 20 μm or at least 50 μm. Other than organic dielectric materials, the glass structure 450 provides high mechanical and thermal robustness and prevents an outer edge of the semiconductor body 100 from mechanical damages, for example cracks, and mechanical strain which may degrade the blocking capabilities of the semiconductor device 500. The vertical extension of the edge termination structure 400 is easily scalable from 2 μm up to several 100 μm.

Other than spin-on-glasses, the glass structure 450 resulting from glass molding as described above does not contain organic components like hydrocarbon compounds which are detectable in probes of spin-on-glass, e.g., by SIMS (secondary ion mass spectrometry). The glass structure 450 can be mechanically connected with silicon-containing structures like the semiconductor body 100 and the auxiliary structure 440 in a form-fitting and force-fitting manner such that no gaps occur between the edge termination structure 400 including the glass structure 450, and the semiconductor body 100 along the horizontal interface with the pedestal structure 130. The glass structure 450 may be in-situ bonded to the semiconductor body 100.

The edge termination structure 400 is mechanically robust, suppresses the occurrence of field peaks along the outer edge of the anode regions 115 and prevents the degradation of the blocking capabilities caused by crystal lattice disturbances and impurities along the edge surface 103.

The glass structure 450 in the edge termination structure 450 further protects the semiconductor body 100 against contact with solder materials used, for example, to solder the semiconductor die onto a support component. In the conductive mode a portion of the semiconductor body 100 between the edge termination structure 400 and the second load electrode 320 mainly remains devoid of a charge carrier plasma such that the edge termination structure 400 intrinsically embodies a high dynamic robustness concept.

With respect to lateral edge termination concepts, the vertical edge termination structure 400 saves chip area. The edge termination structure 400 including the glass structure 450 as well as the overlapping first load electrode 310 are easily scalable for semiconductor devices 500 specified for different voltage classes.

In FIG. 1B the edge termination structure 400 extends at least from a plane which is coplanar with the first surface 101 to a plane which is coplanar with the second surface 102. The second load electrode 320 directly adjoins the edge termination structure 400. A slope angle α between the perpendicular to the first surface 101 and the edge surface 103 may be between −60 and +60 degree. As regards further details reference is made to the description of FIG. 1A.

The edge surface 103 of the semiconductor device 500 in FIG. 1C includes a horizontal portion 103*b* parallel to the first surface 101 and non-horizontal portions 103*a*, 103*c* connecting the horizontal portion 103*b* with the first and the second surfaces 101, 102. According to the illustrated embodiment, the non-horizontal portions 103*a*, 103*c* are approximately vertical. An outer edge 104 of the edge termination structure 400 may be flush with an outer edge of the outer one of the non-horizontal sections 103*a*, 103*c*. The edge termination structure 400 may fill a step formed in the stepped edge surface 103 completely and without voids. In the blocking mode, equipotential lines exit from the semiconductor body 100 exclusively along the protected non-horizontal section 103*a*.

FIG. 1D illustrates an embodiment with stepped edge surface 103 and a sloped non-horizontal portion 103*a* between the first surface 101 and a horizontal portion 103*b*.

The semiconductor devices 500 of FIGS. 2A and 2B are IGFETs with the semiconductor bodies 100 including trench structures with gate electrodes 150 and gate dielectrics 155 insulating the gate electrodes 150 from body regions 115*a* of the second conductivity type. The trench structures may further include field electrodes 160 and field dielectrics 170 insulating them from the semiconductor material of the semiconductor body 100 as well as from the gate electrodes 150. Lateral cross-sectional areas of the trench structures may be circles, ovals or rectangles with or without rounded corners or stripes. According to other embodiments, the trench structures may be stripes. The trench structures may taper with increasing distance to the first surface 101, may have rounded or edged bottom portions and straight or bulgy sidewalls. The semiconductor device 500 may include trench structures of different vertical and/or lateral dimensions.

In FIG. 2A a termination region 115*z* of the second conductivity type extends in the semiconductor body 100 along at least a portion of the first surface 101 between the outermost trench structure and the edge termination structure 400. In FIG. 2B the termination region 115*z* is absent and a portion of the drift zone 120 adjoins the first surface 101 between the outermost trench structure and the edge termination structure 400.

A dielectric structure 220 may be formed between the first load electrode 310 and the first surface 101, wherein contact structures 305 extend through openings in the dielectric structure 220 between the first load electrode 310 and the semiconductor body 100. The contact structures 305 may extend into the semiconductor body 100 and may directly adjoin the body regions 115*a* as well as source regions 110 of the first conductivity type, which may be formed along the first surface 101 and which the body regions 115*a* separate from the drift zone 120. The thicker the dielectric structure 220 is the more a field plate, which is embodied by a portion of the first load electrode 310, overlaps with the glass structure 450.

The first load electrode 310 is effective as a source electrode which may be or which may be electrically coupled or connected to a source terminal S. The second load electrode 320 may form a drain electrode, which may be or which may be electrically coupled or connected to a drain terminal D. For further details, reference is made to the description of FIGS. 1A to 1D.

In FIGS. 3A and 3B the respective semiconductor device 500 is an IGBT, for example an RB-IGBT (reverse blocking IGBT) or RC-IGBT (reverse conducting IGBT), a PT-IGBT (punch-through IGBT) or an NPT-IGBT (non-punch-through IGBT).

The first load electrode 310 is an emitter electrode which may be or which may be electrically connected or coupled to an emitter terminal E. The second load electrode 320 is a collector electrode which may be or which may be electrically connected or coupled to a collector terminal C. The pedestal region 130 is a collector layer that may have the second conductivity type or that may include zones of both conductivity types.

The IGBTs may include trench structures including gate electrodes 150 and gate dielectrics 155 dielectrically insulating the gate electrodes 150 from body regions 115*a* of the second conductivity type. The body regions 115*a* separate source regions 110 of the first conductivity type and formed along the first surface 101 from the drift zone 120. Some or all of the trench structures may include gate electrodes and some trench structures may include field electrodes or floating electrodes. For further details, for example as regards the trench structures, reference is made to the description of FIGS. 1A and 1D as well as FIGS. 2A to 2B.

FIG. 4A schematically shows an edge termination structure 400 of a semiconductor diode 501 mounted on an electrically conducting support component 600 projecting beyond a vertical edge surface 103 of a semiconductor body 100. In addition to the vertical field lines within the semiconductor body 100 further field lines exiting from the projecting portion of the support component 600 enter the semiconductor body 100 in a portion of the edge surface 103 around a pn junction between a drift zone 120 and an anode region 115 in the semiconductor body 100. The electric field strength is locally increased and may result in a local breakdown.

Figure 4B:
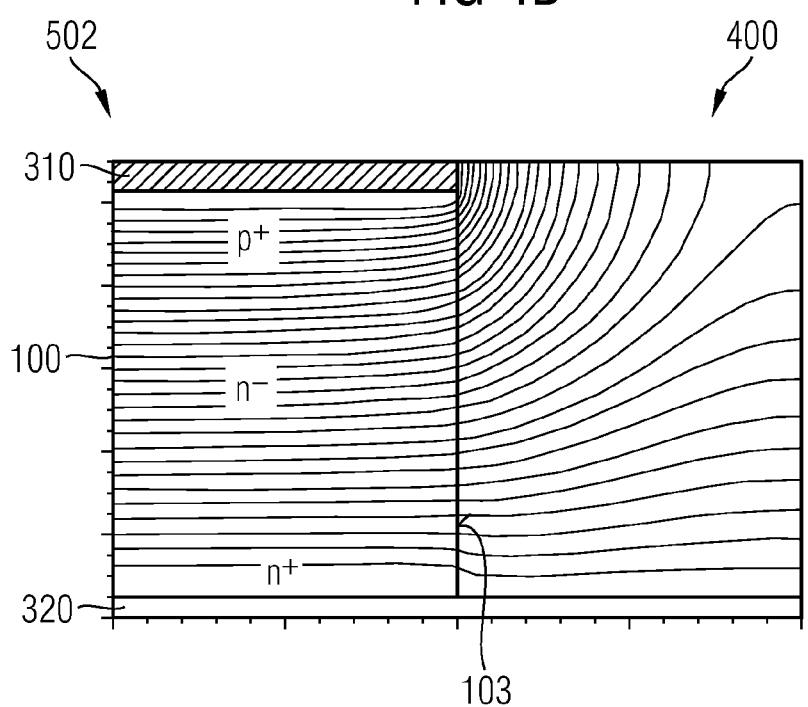
FIG. 4B is a schematic cross-sectional view of an edge termination structure of a semiconductor device according to a comparative example for illustrating effects of the embodiments.

FIG. 4B shows the equipotential lines for a comparative example of a semiconductor diode 502 with the first load electrode 310 not protruding beyond a vertical edge surface 103 of the semiconductor body 100 as well as a second load electrode 320 projecting beyond an edge surface 103. In the semiconductor body 100 the equipotential lines are bowed and denser in a region where the pn junction meets the edge surface 103.

Figure 4C:
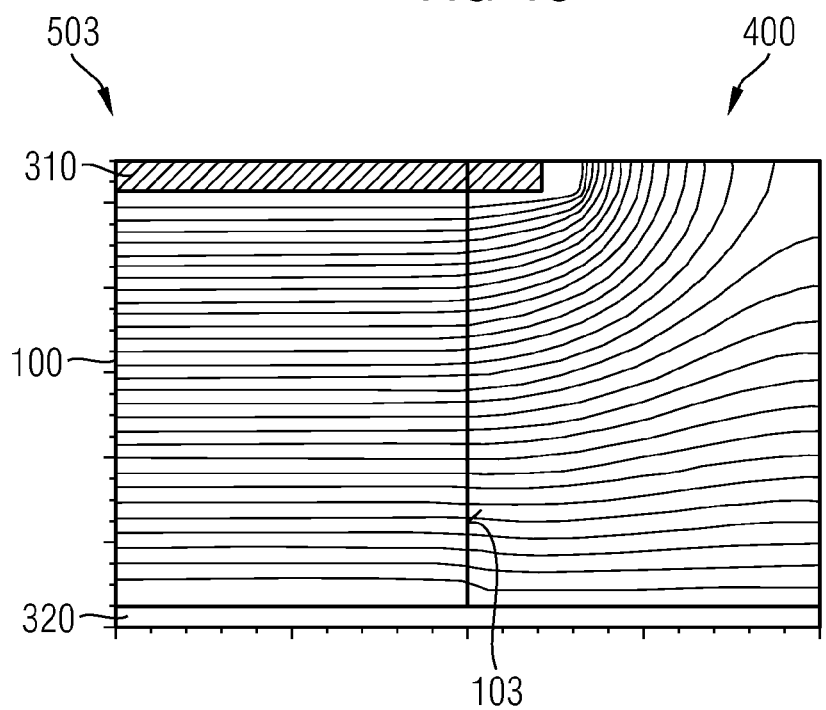
FIG. 4C is a schematic cross-sectional view of an edge termination structure of a semiconductor device in accordance with an embodiment for illustrating effects of the embodiments.

By contrast, the semiconductor diode 503 of FIG. 4C includes a first load electrode 310 that projects beyond the edge surface 103 and partially overlaps the adjoining edge termination structure 400. The equipotential lines are disturbed only within the edge termination structure 400 that can support a higher electric field strength without breaking through. Within the semiconductor body 100 the equipotential lines are parallel to each other and the electric field strength is not locally increased within the semiconductor body 100.

Figure 5A:
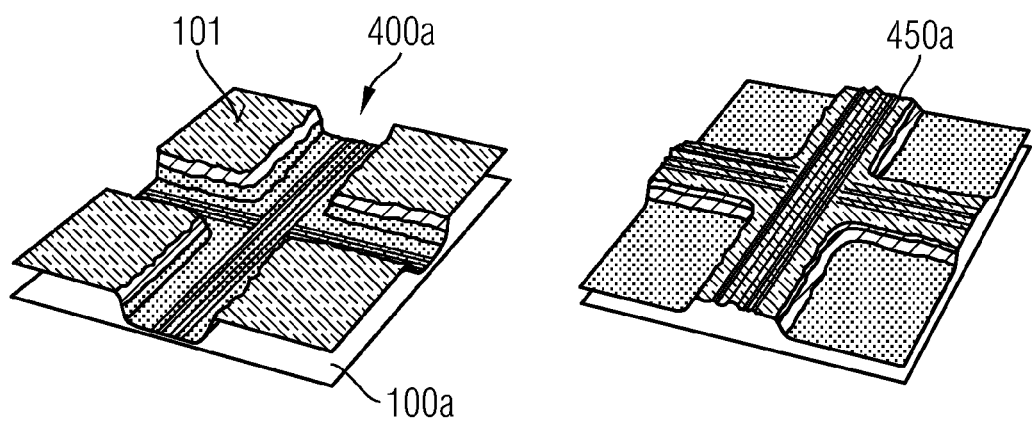
FIG. 5A is a schematic perspective view of a semiconductor substrate and a glass piece for illustrating effects of an embodiment related to the manufacture of semiconductor devices.

FIG. 5A shows a base substrate 100*a* with a frame trench 400*a* extending from a first surface 101 into the base substrate 100a. The glass piece 450a on the right-hand side is obtained by glass molding including pressing a source material onto the first surface 101 of the base substrate 100a such that the source material fluidifies, flows into the frame trench 400a and re-solidifies after filling the frame trench 400a completely.

Figure 5B:
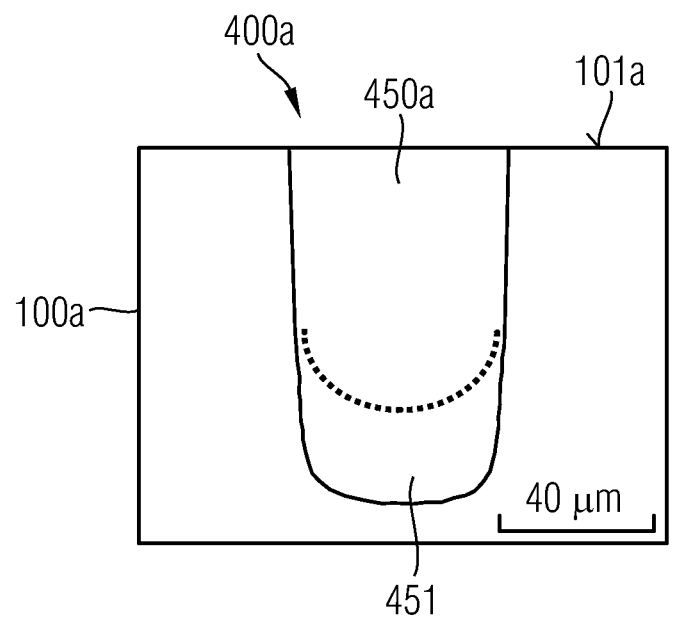
FIG. 5B is a schematic cross-sectional view of a portion of a semiconductor device including a partially filled frame trench for illustrating effects of an embodiment related to the manufacture of semiconductor devices.
Figure 5C:
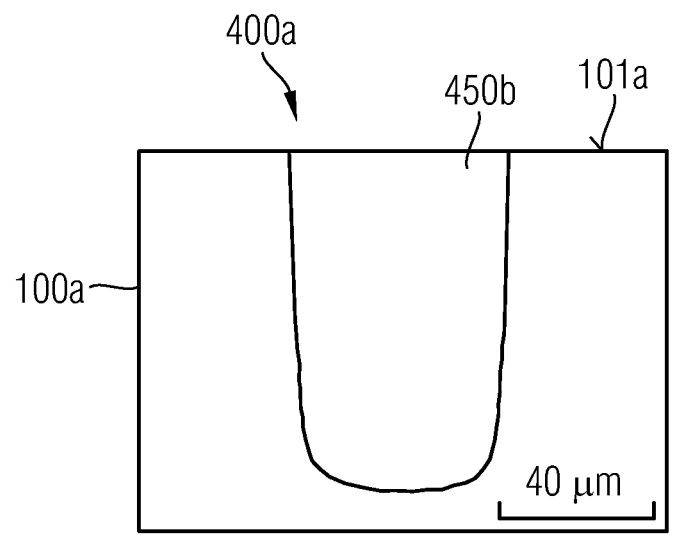
FIG. 5C is a schematic cross-sectional view of a portion of another semiconductor device including a completely filled frame trench for illustrating effects of an embodiment related to the manufacture of semiconductor devices.

FIG. 5B shows a frame trench 400a with a width of approximately 50 μm and a depth of approximately 100 μm. A source material is brought into contact with the first surface 101a of the base substrate 100a, and pressed against the base substrate 100a at a temperature at which the source material fluidifies. After re-solidifying, a glass structure 450a fills the upper portion of the frame trench 400a and leaves a void 451 in a lower portion of the frame trench 400a. FIG. 5C shows the same frame trench 400a after a press capacity (force) has been exerted sufficiently long. A glass structure 450b fills the frame trench 400a completely with no void between the base substrate 100a and the glass structure 450b.

Figure 6A:
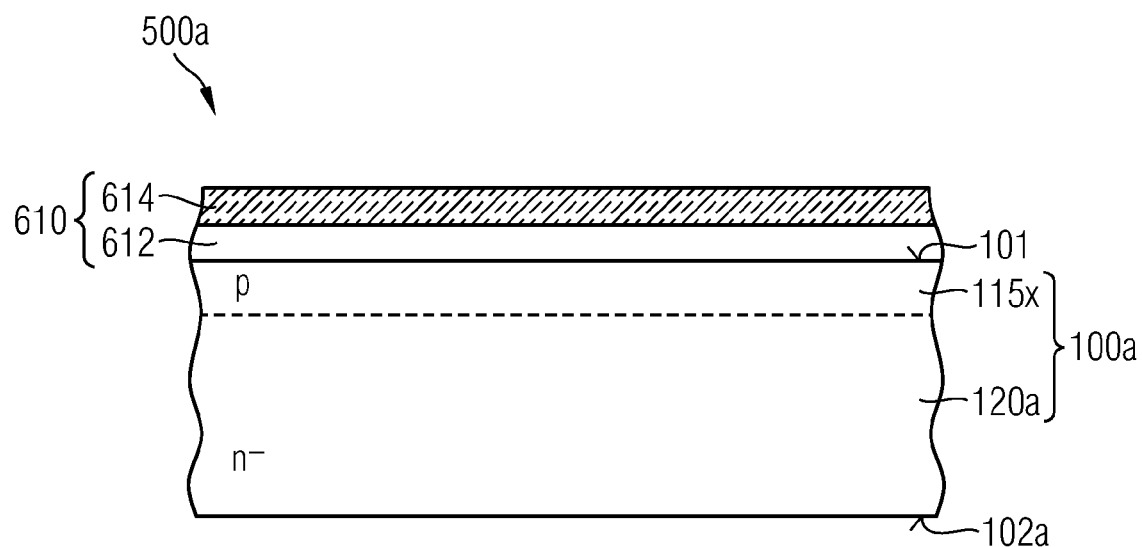
FIG. 6A is a schematic cross-sectional view of a portion of a semiconductor substrate for illustrating a method of manufacturing a semiconductor device according to an embodiment related to semiconductor diodes after providing a first mask layer.
Figure 6B:
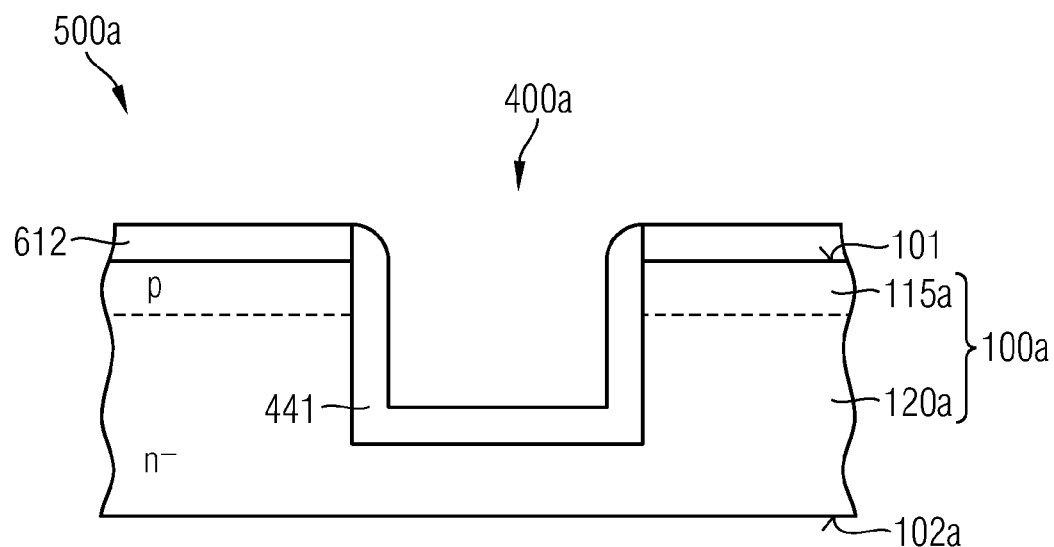
FIG. 6B is a schematic cross-sectional view of the semiconductor substrate portion of FIG. 6A after forming a first auxiliary layer lining a frame trench.
Figure 6C:
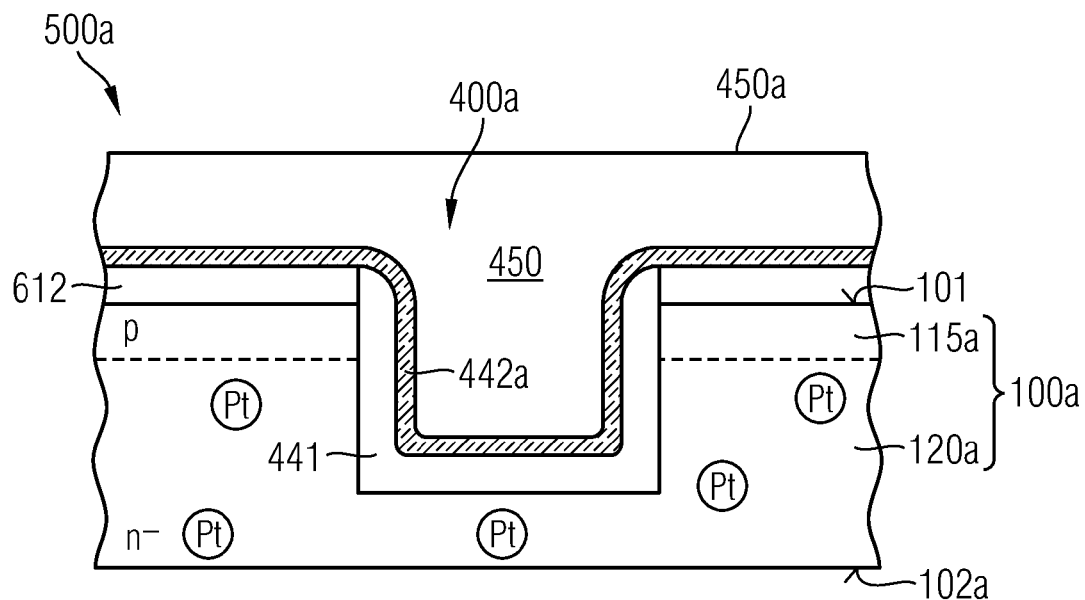
FIG. 6C is a schematic cross-sectional view of the semiconductor substrate portion of FIG. 6B after filling the frame trench by glass molding.
Figure 6D:
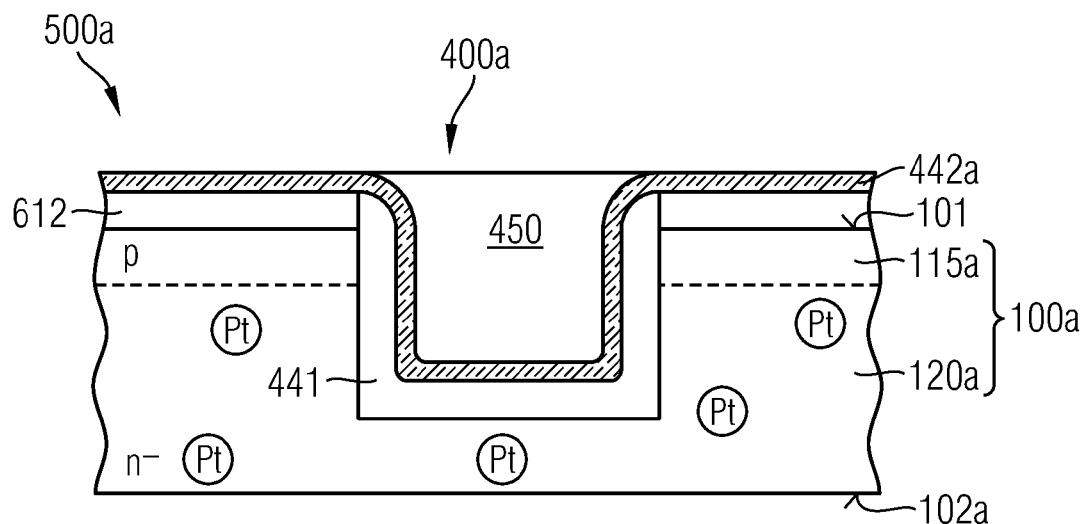
FIG. 6D is a schematic cross-sectional view of the semiconductor substrate portion of FIG. 6C after removing portions of a glass piece outside the frame trench.
Figure 6E:
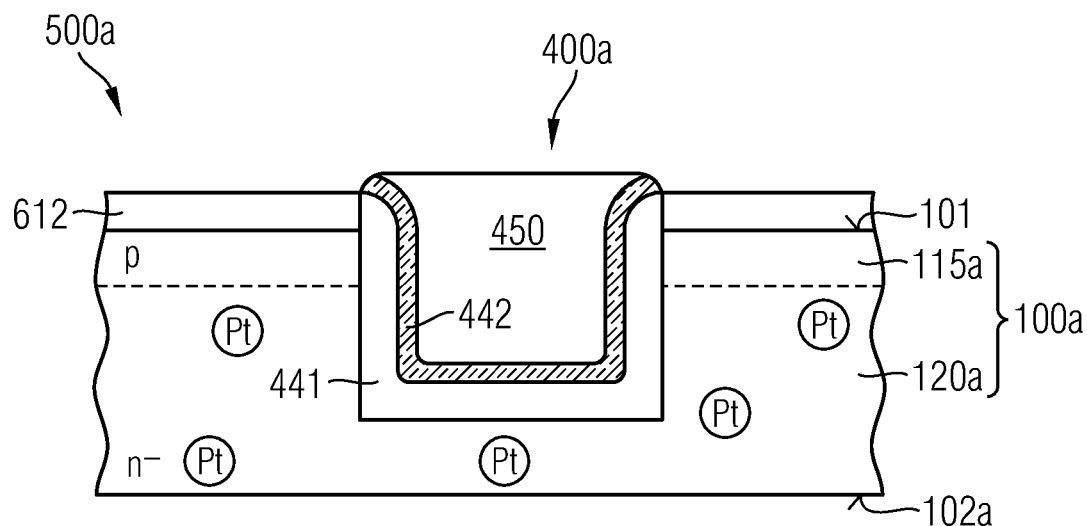
FIG. 6E is a schematic cross-sectional view of the semiconductor substrate portion of FIG. 6D after removing portions of a second auxiliary layer outside the frame trench.
Figure 6F:
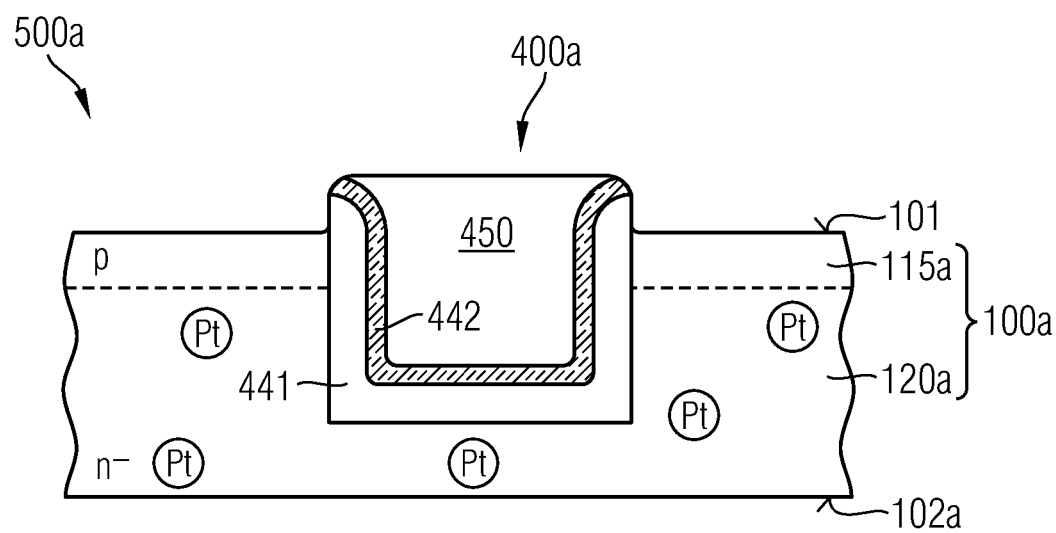
FIG. 6F is a schematic cross-sectional view of the semiconductor substrate portion of FIG. 6E after exposing a first substrate surface of a base substrate.
Figure 6G:
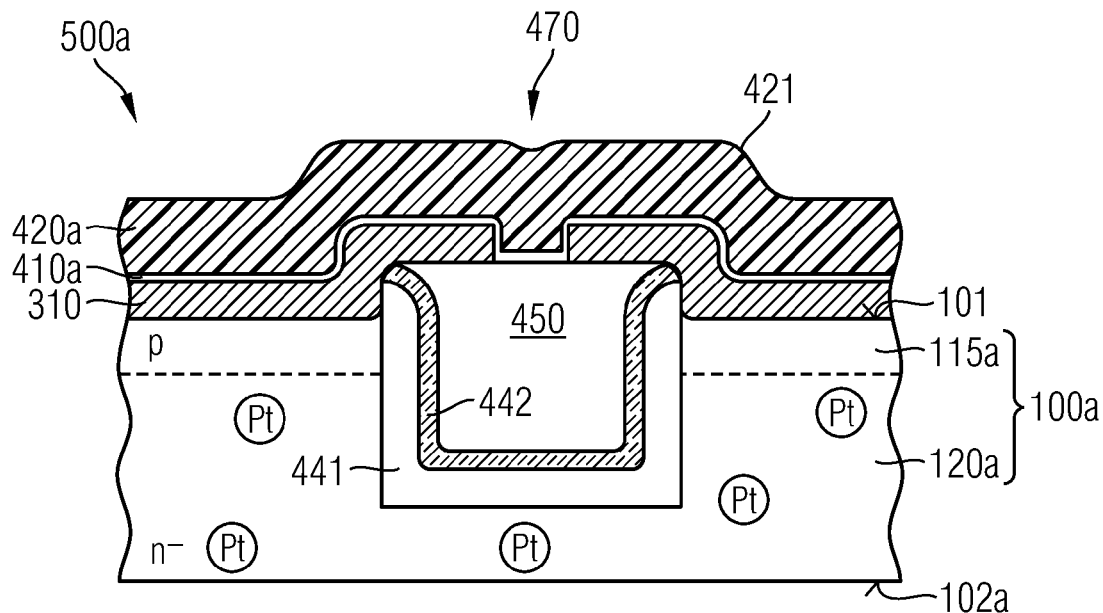
FIG. 6G is a schematic cross-sectional view of the semiconductor substrate portion of FIG. 6F after forming a protection layer.
Figure 6H:
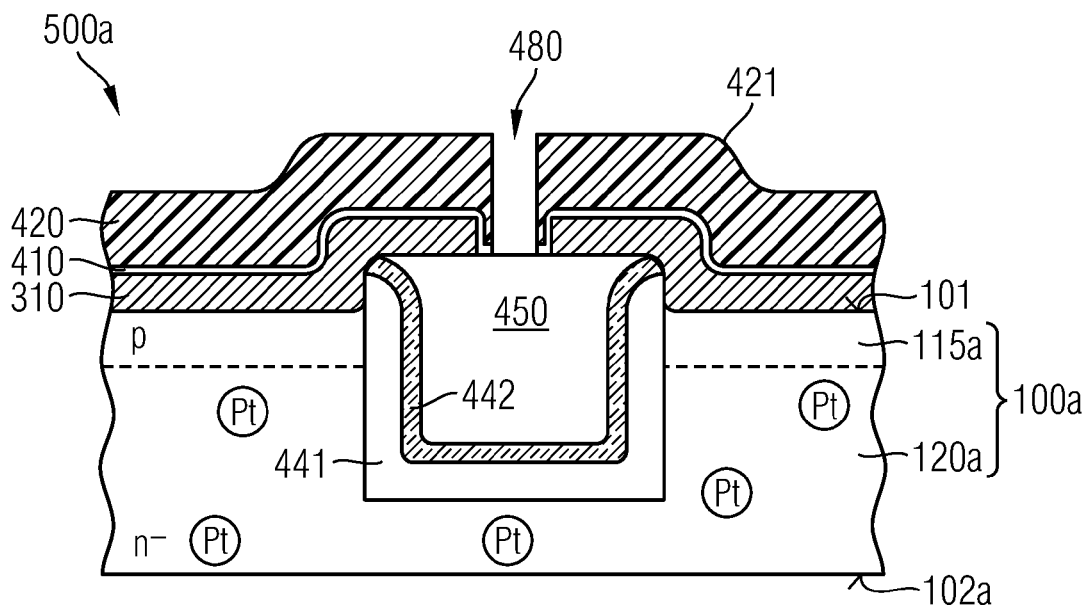
FIG. 6H is a schematic cross-sectional view of the semiconductor substrate portion of FIG. 6G after exposing a portion of the glass structure in the frame trench.
Figure 6I:
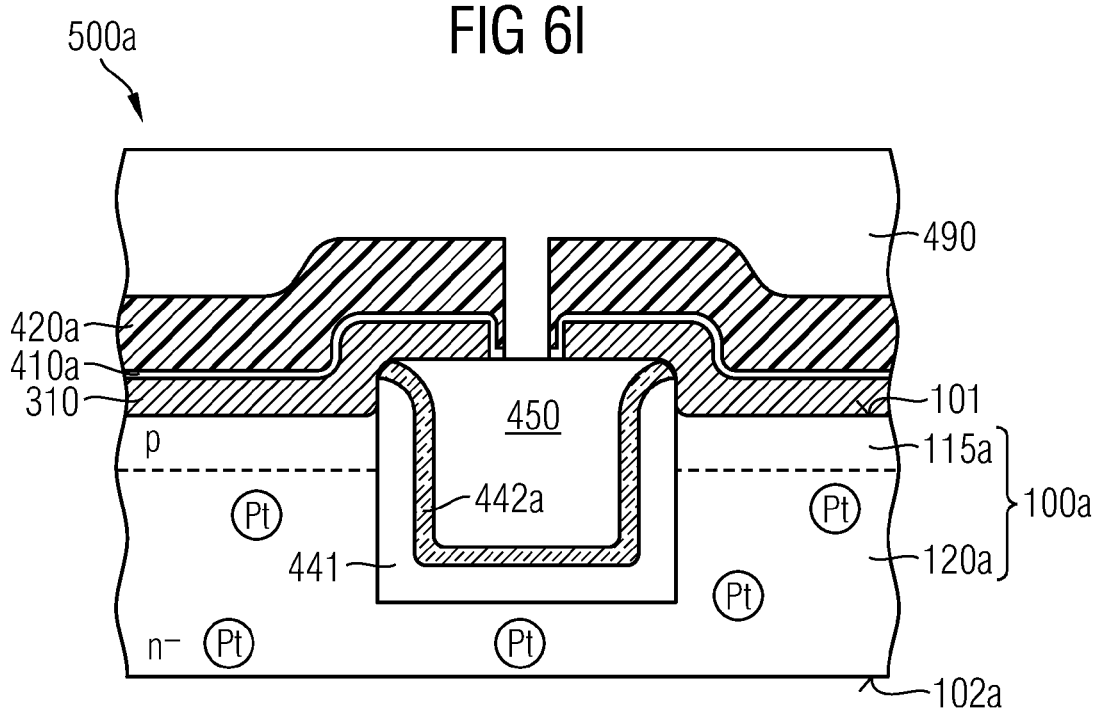
FIG. 6I is a schematic cross-sectional view of the semiconductor substrate portion of FIG. 6H after mounting the semiconductor substrate on a carrier.
Figure 6J:
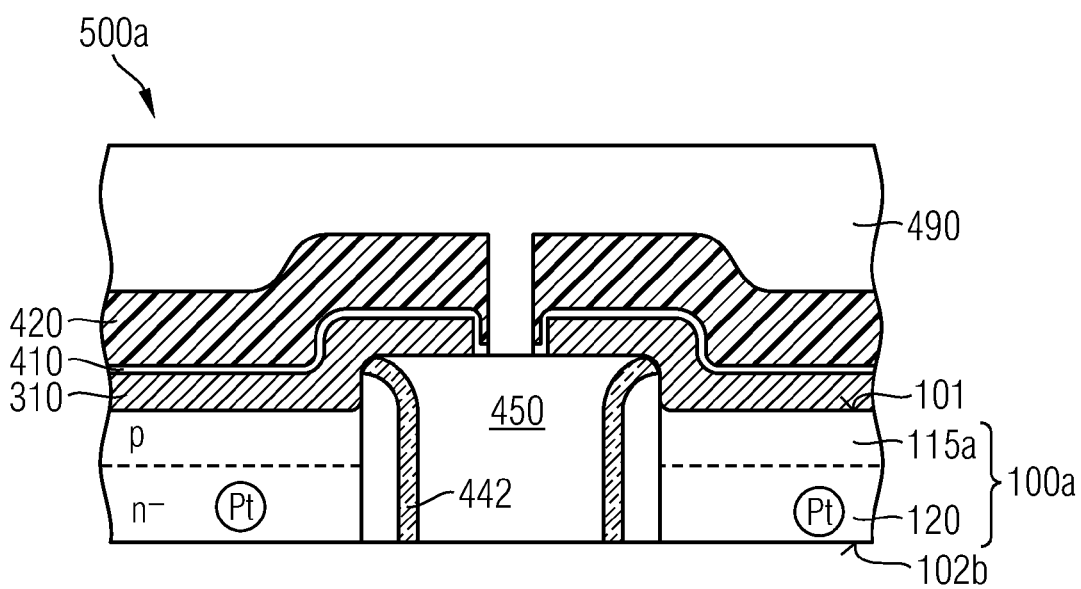
FIG. 6J is a schematic cross-sectional view of the semiconductor substrate portion of FIG. 6I after thinning the semiconductor substrate from a process surface opposite to the carrier.
Figure 6K:
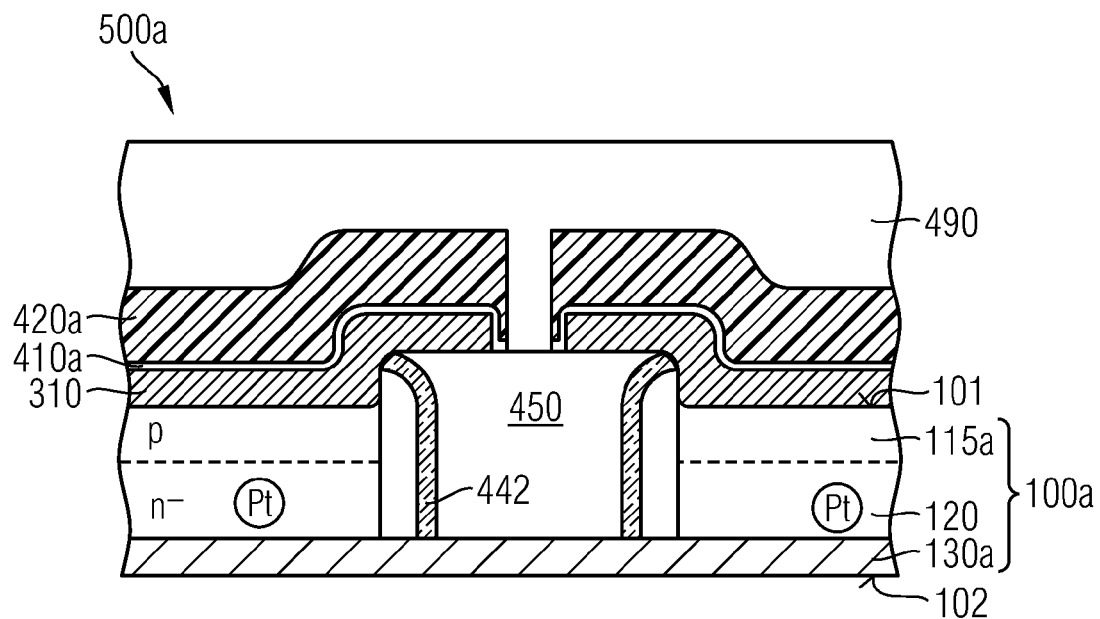
FIG. 6K is a schematic cross-sectional view of the semiconductor substrate portion of FIG. 6J after forming an amorphous semiconductor layer on a rear side opposite to the carrier.
Figure 6L:
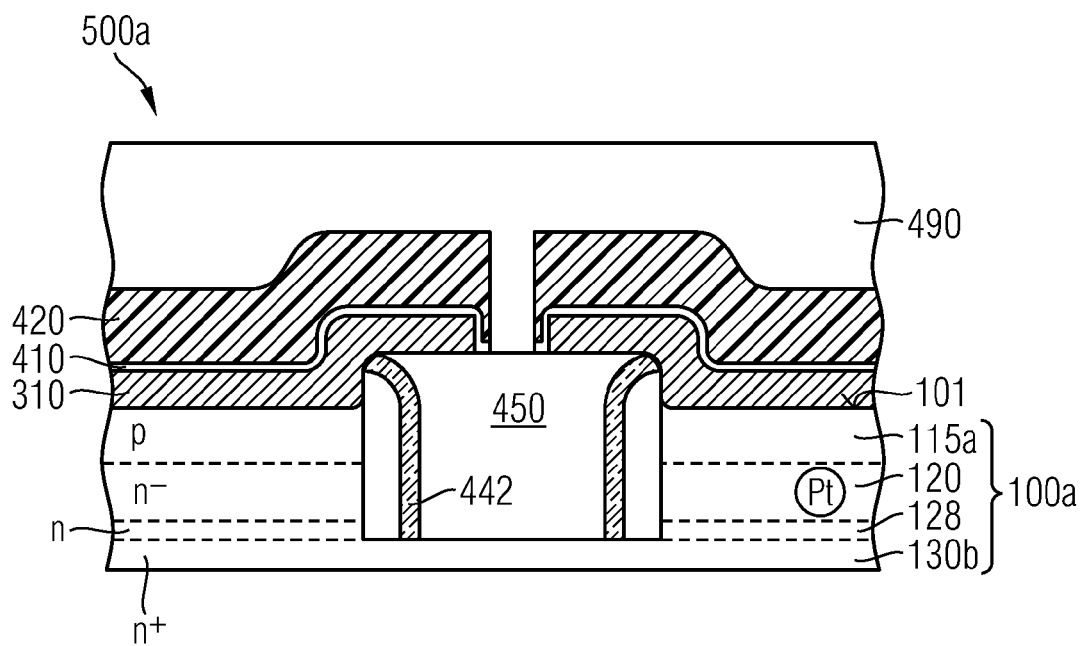
FIG. 6L is a schematic cross-sectional view of the semiconductor substrate portion of FIG. 6K after forming a pedestal region on the side opposite to the carrier.
Figure 6M:
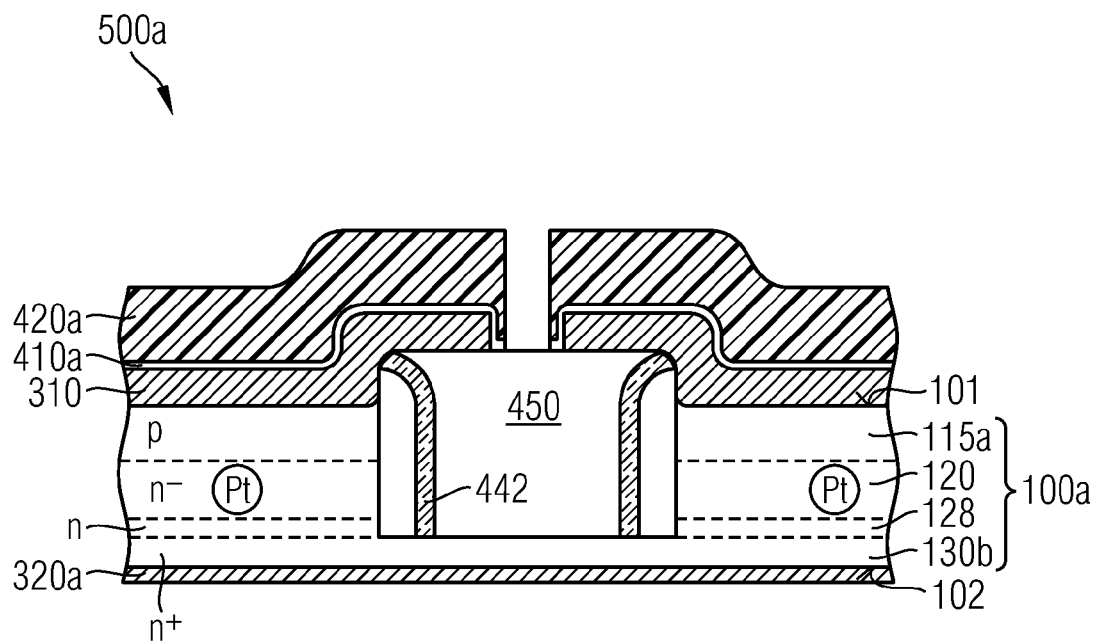
FIG. 6M is a schematic cross-sectional view of the semiconductor substrate portion of FIG. 6L after removing the carrier and forming a rear side metallization.
Figure 6N:
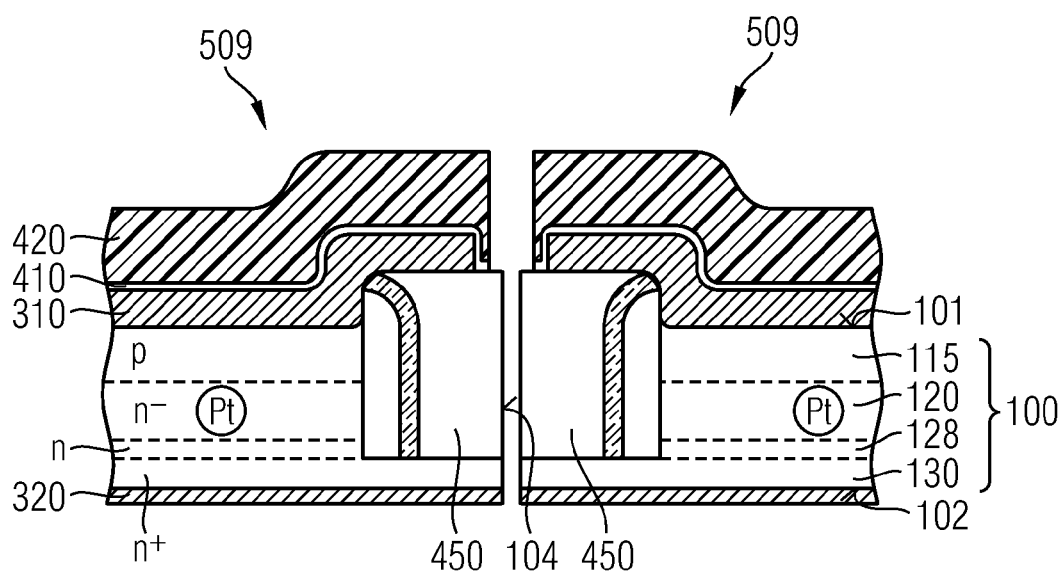
FIG. 6N is a schematic cross-sectional view of two semiconductor dies obtained from the semiconductor substrate of FIG. 6M.

FIGS. 6A to 6N refer to a method of manufacturing semiconductor devices with a vertical edge termination structure as discussed above. A first sacrificial layer 612 is formed on a first surface 101 of a base substrate 100a. The base substrate 100a is a single-crystalline semiconductor material, e.g., silicon (Si), germanium (Ge), silicon germanium crystal (SiGe), silicon carbide (SiC), gallium arsenide (GaAs), gallium nitride (GaN) or another $A_{III}B_V$ semiconductor and may contain impurities of a first conductivity type. According to an embodiment, the base substrate 100a is a silicon wafer with a thickness of, for example, 600 to 800 μm.

The first sacrificial layer 612 may be a semiconductor oxide, e.g., a silicon oxide grown by thermal oxidation on the first surface 101. A first mask layer 614 may be deposited on the first sacrificial layer 612. The first mask layer 614 may be provided from a material against which the materials of the first sacrificial layer 612 and the base substrate 100a may be etched with high selectivity. According to an embodiment the first mask layer 614 is a silicon nitride layer deposited from the gaseous phase using CVD (chemical vapor deposition). Impurities of a second conductivity type opposite to the first conductivity type may be implanted through the first surface 101 into a portion of the base substrate 100a oriented to the first surface 101. According to the illustrated embodiment, the first conductivity type is the n-type and the second conductivity type the p-type, wherein the implanted impurities may be boron, aluminum, gallium and/or indium atoms/ions, by way of example. According to other embodiments, the base substrate 100a may have the p-type and n-type impurities are implanted through the first surface 101.

FIG. 6A shows the first mask layer 614 deposited on the first sacrificial layer 612 which together form a hard mask 610 on the first surface 101 of the base substrate 100a. In the base substrate 100a a p-type impurity region along the first surface 101 forms an anode layer 115x and the remaining n-type portion forms a drift layer 120a. A pn junction between the anode and drift layers 115x, 120a extends parallel to the first surface 101. An impurity concentration of the p-type impurities may depend from the diffusion depth reached during thermal diffusion, wherein the area dose may be in a range from $2E12$ $cm^{-2}$ to $5E13$ $cm^{-2}$.

In regions assigned to active areas of semiconductor devices device-specific processes may be performed during which the illustrated edge regions remain covered by the hard mask 610. For example, in the active areas the hard mask may be used to form transistor cells including gate electrodes formed in trench structures extending from the first surface 101 into the base substrate 100a. Further implants of the first conductivity type may provide source zones along the first surface 101.

Before providing a front side metallization layer or, if applicable, an intermediate dielectric on the first surface 101, the formation of a vertical edge termination structure may be initiated, for example by locally opening the hard mask 610. Since a plurality of identical semiconductor devices are formed from one single base substrate 100a, the opening forms a grid with the active areas of the semiconductor devices formed in the meshes of the grid. A photoresist layer is deposited, partially exposed using a photolithographic mask and developed. The developed photoresist layer forms an etch mask for transferring the pattern from the photoresist layer into the hard mask 610 by using wet etch or plasma etch processes to form a patterned hard mask from the hard mask 610.

An isotropic or anisotropic dry or wet etch process forms a frame trench 400a in the base substrate 100a, wherein openings in the patterned hard mask define position and width of the frame trench 400a. The etch process may be based on an alkaline solution like KOH (potassium hydroxide) or TMAH (tetramethyl ammonium hydroxide), which may contain modifications and additives like surfactants, dissolved gases and the like. According to an embodiment, wet etch processes are used that prevent crystal defects along the sidewalls of the frame trench 400a. If applicable, a further selective wet etch may remove portions of the patterned hard mask projecting beyond the edges of the frame trench 400a. Impurities may be introduced through the sidewalls of the frame trench 400, for example using an implantation which is tilted against the vertical direction by, for example at least 5 degree and at most 85 degree. A LOCOS (local oxidation of silicon) process may locally oxidize exposed portions of the base substrate 100a. The local oxidation may be combined with a heating process for activating the implant for the anode layer 115a. In the frame trench 400a the locally generated oxide layer forms a first auxiliary layer 441. According to other embodiments, instead of or in addition to the local oxidation, other dielectric materials may be deposited, for example a nitride, a CVD oxide or semi-insulating layers from amorphous or polycrystalline materials like amorphous silicon (a-Si), amorphous carbon hydrogen (a-C:H) or a plurality of layers.

FIG. 6B shows the frame trench 400a extending from the first surface 101 into the base substrate 100a through the segmented anode layer 115a. Remnants of the first mask layer 614 may be removed. The first sacrificial layer 612 covers the first surface 101 and the first auxiliary layer 441 covers sidewalls and the bottom portion of the frame trench 400a. The depth of the frame trench 400a depends on a blocking voltage for which the finalized semiconductor devices are specified. For example, in semiconductor devices specified for a blocking voltage of 1200 V, the depth of the frame trench 400a may be at least 100 μm, for example at least 120 μm. The width of the frame trench 400a may be between 10 and 200 μm, by way of example. The first auxiliary layer 441 may be or may include a contamination barrier or may form an adhesive interface with the following layers.

Atoms/ions which are effective as recombination centers may be introduced through the first surface 101, for example platinum (Pt) or gold (Au). Also crystal lattice damage by e.g. helium (He) or hydrogen (H) implantation can act recombinative. A deposition method, e.g., CVD deposits a stop layer 442a that may line a front side of the semiconductor substrate 500a oriented to the first surface 101 in a conformal manner. The stop layer 442a may be a silicon nitride layer, by way of example. If applicable, atoms/ions effective as recombination center may be introduced through a process surface 102a averted from the front side.

A source material is brought into contact with the front surface of the semiconductor substrate 500a defined by the first surface 101. The source material exhibits a glass transition and fluidifies when the temperature of the source material exceeds the glass transition temperature. The source material may be soda-lime glass with a glass transition temperature above 400 degree Celsius, undoped silica, silica doped with at least one dopant, the dopant(s) selected from a group containing boron B, sodium Na, calcium Ca, potassium K, lead Pb, and aluminum Al. The source material may be a flat glass piece, e.g. a glass disc with a flat surface. According to other embodiments, the source material may be a glass piece with preformed protrusions approximately complementary to the frame trench 400a. A press capacity (force) is exerted to press the source material and the semiconductor substrate 500a against each other. Press capacity and temperature of the source material are controlled to exceed the glass transition temperature in the course of pressing. The source material fluidifies and the fluidified source material flows into the frame trench 400a. A process time is selected such that the source material fills the frame trench 400a completely. Then, the press capacity and the temperature of the source material are controlled in a way that the fluidified source material re-solidifies.

FIG. 6C shows a re-solidified glass piece 450a resulting from the glass molding. A portion of the glass piece 450a fills the frame trench 400a completely. The glass piece 450a can be mechanically connected with silicon-containing structures in a form-fitting and force-fitting manner, wherein no gaps remain between the glass piece 450a including the glass structure 450 and the base substrate 100a. The glass piece 450a may be in-situ bonded to the stop layer 442a which may be effective as an adhesive interface. The glass piece 450a and the base substrate 100a may form a laminate or a bonded composite after re-solidifying of the source material. Other than organic dielectrics based on polymers like BCB or imides the insulator characteristics of the glass piece 450a are long-time stable and reliable.

The formation of the glass piece 450a may get along without high temperature processes above 600 degree Celsius. Other than methods like spin-on, stencil-print or inkjet print, glass molding fills wide and deep trenches at high quality without voids. The thermal expansion coefficient may be adjusted using suitable dopants in the glass piece 450a.

A thinning process including grinding, polishing and/or, etching, for example, spin-etch or CMP (chemical mechanical polishing), removes portions of the glass piece 450a outside the frame trench 400a, wherein the exposure of portions of the stop layer 442a may terminate the thinning process. For example, the exposure of the stop layer 442a may deliver an optical stop signal or the stop layer 442a is robust against the thinning process and impacts the thinning process in a way that the exposure of the stop layer 442a can be detected by monitoring a process parameter.

FIG. 6D shows a remaining glass structure 450 filling the frame trench 400a. Outside the frame trench 400a portions of the stop layer 442a are exposed. The portions of the stop layer 442a outside the frame trench 400 as well as the first sacrificial layer 612 may be removed at high material selectivity, for example using an appropriate wet etch solution.

FIG. 6E shows the first sacrificial layer 612 exposed by removal of the portions of the stop layer 442a outside the frame trench 400a. Within the frame trench 400a remaining portions of the stop layer 442a may form a second auxiliary layer 442.

FIG. 6F shows the semiconductor substrate 500a with exposed first surface sections 101 after removal of the first sacrificial layer 612.

An interlayer dielectric may be deposited on the first surface 101 and above the glass structure 450. If applicable, remnant portions of the first sacrificial layer 612 may be part of the interface dielectric. A front metallization layer is formed on the front side of the semiconductor substrate 500a, e.g., by using a galvanic deposition process that may use a lithography step effective on a seed layer or by PVD (physical vapor deposition), for example vapor deposition or sputtering, wherein the deposited front metallization layer is patterned by lithography to form a front metallization with openings 470 above the glass structures 450.

A passivation layer 410a may be deposited that covers the front metallization and that lines the opening 470. The passivation layer 410a may be a dielectric passivation layer. A protection layer 420a may be deposited on the passivation layer 410a.

FIG. 6G shows the front metallization forming first load electrodes 310. The passivation layer 410a covers the first load electrodes 310 and a portion of the glass structure 450. The material of the passivation layer 410a may be a hard dielectric such as silicon oxide, silicon nitride or silicon oxynitride. The passivation layer 410a may be a homogeneous layer or may include two or more different sub-layers. The material(s) of the protection layer 420a covering the passivation layer 410a may include polymers, for example a polyimide, benzocyclobutene or polybenzoxazole.

A further lithographic process defines a frame opening 480 through the protection layer 420a and the passivation layer 410a over and within the opening 470 between the first load electrodes 310. The process may be combined with exposing bond pad areas of the first load electrodes 310.

The lithography process may include plasma and/or wet etch processes. The mask for the frame opening 480 in the passivation and protection layers 410a, 420a may be adjusted by detecting the slopes 421 of the protection layer 420 along the edges of the glass structure 450 or the edges of specific additional adjustment features.

FIG. 6H shows the frame opening 480 separating the deposited protection and passivation layers 420a, 410a into separated protection and passivation layers 420, 410. The frame opening 480 is aligned to the opening 470 separating the first load electrodes 310. A carrier 490 may be mounted onto the front side of the semiconductor substrate 500a.

FIG. 6I shows the carrier 490 which may include an adhesive layer and a main portion. The main portion may be a rigid carrier, e.g., a glass plate, or a grinding tape. The adhesive layer could be deposited separately or in combination with the main portion. The carrier 490 mechanically stabilizes the semiconductor substrate 500a and protects the front side during the following processes.

A thinning or grinding process that may or may not include etch processes and chemical mechanical polishing processes thins the base substrate 100a from a process surface 102a at a rear side of the semiconductor substrate 500a opposite to the front side. The thinning process may be controlled to stop immediately at or with a time lag after detection of the buried edge of the first auxiliary layer 441, or the buried edge of the second auxiliary layer 442 or the buried edge of the glass structure 450, respectively.

According to the embodiment illustrated in FIG. 6J the thinning process removes portions of the base substrate 100a below the buried edge of the glass structure 450 and exposes a working surface 102b opposite to the first surface 101.

A deposition process, for example, a physical sputter process may deposit an amorphous silicon layer on the working surface 102b. According to other embodiments, a metal or a patterned reflex layer may be deposited on the working surface 102b.

FIG. 6K shows the deposited amorphous pedestal layer 130a forming an amended portion of the base substrate 100a.

An anneal, for example an LTA (laser thermal anneal) may transform the amorphous pedestal layer 130a of FIG. 6K into a crystalline pedestal layer 130b whose crystal lattice may grow in registry with the crystal lattice of the base substrate 100a. A patterned reflex layer may represent an optic barrier for the laser illumination. Alternatively, the laser exposure may be patterned for local activation. N-type impurities, for example phosphorus atoms/ions may be introduced from the exposed surface of the crystalline pedestal layer 130b, for example through implants at one, two or more implant energies. Outdiffusion of the implants may be controlled, at least partly by the LTA from the rear side.

FIG. 6L shows the crystalline pedestal layer 130b, which for IGFETs and diodes has the first conductivity type and which for IGBTs may have the second conductivity type, or, for RC-IGBTs (reverse conducting IGBTs) and some diode types, e.g. MCDs (MOS controlled diode) may have zones of both the first and second conductivity types. The outdiffused impurities may also form a field stop layer 128. According to other embodiments, the field stop layer 128 may be formed by implanting impurities, e.g., protons.

Proceeding with FIG. 6M, the carrier 490 may be removed from the semiconductor substrate 500a and a rear metallization layer 320a may be deposited, for example, sputtered onto the exposed surface of the crystalline pedestal layer 130b. The carrier 490 may be removed before or after the deposition of the rear metallization layer 320a.

A separation process divides the semiconductor substrate 500a of FIG. 6M into a plurality of identical semiconductor dies 509 as illustrated in FIG. 6N, each with a semiconductor body 100 including an anode region 115 along the first surface 101, a pedestal region 130 along the second surface 102, a drift zone 120 forming a pn junction with the anode region 115 and a field stop layer 128 separating the drift zone 120 from the pedestal region 130. The separation process may be performed with the carrier 490 still attached to the semiconductor substrate 500a of FIG. 6M or after attaching a further carrier, e.g. a dicing frame including a tape, on the rear side at the second surface 102 of the semiconductor substrate 500a.

A portion of an outer surface 104 of the semiconductor die 509 along which equipotential lines leave the semiconductor die 509 in a blocking mode is formed by a portion of the glass structure 450. The glass structures 450 passivate and protect the sidewalls of the semiconductor bodies 100. In addition the sidewall of the semiconductor body 100 is not formed by sawing or another mechanical process locally damaging the crystal lattice.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
   a semiconductor body with a first surface at a first side, a second surface opposite to the first surface and an edge surface connecting the first and second surfaces, wherein
      the semiconductor body comprises a drift zone from a first conductivity type the drift zone extending from an anode region to one of a pedestal region or a field stop layer, the drift zone forming a pn junction with the anode region and a unipolar homojunction with the field stop layer or the pedestal layer;
      an edge termination structure including a glass structure and extending along the edge surface at least from a plane coplanar with the first surface towards the second surface, wherein the glass structure results from a glass molding process and does not contain hydrocarbon compounds; and
      a conductive structure extending parallel to the first surface and overlapping the glass structure at the first side.

2. The semiconductor device of claim 1, wherein the pedestal region is heavily doped and directly adjoins the second surface and the edge surface, and the glass structure extends to at least the pedestal region.

3. The semiconductor device of claim 2, wherein the pedestal region extends parallel to the second surface.

4. The semiconductor device of claim 1, wherein the edge termination structure extends at least from the first surface to a plane coplanar with the second surface.

5. The semiconductor device of claim 1, wherein the edge termination structure includes an auxiliary structure in direct contact with at least a portion of the edge surface.

6. The semiconductor device of claim 1, wherein the edge termination structure includes an auxiliary structure in direct contact with the complete edge surface.

7. The semiconductor device of claim 1, wherein the edge surface is planar.

8. The semiconductor device of claim 1, wherein the edge surface comprises a horizontal section parallel to the second surface.

9. The semiconductor device of claim 1, wherein the conductive structure is a first load electrode of the semiconductor device.

10. The semiconductor device of claim 1, wherein an overlap between the conductive structure and the edge termination structure is at least 1% of a vertical extension of the semiconductor body.

11. The semiconductor device of claim 1, further comprising:
    a further conductive structure connected to the second surface and overlapping the glass structure.

12. The semiconductor device of claim 1, further comprising:
    a protection layer based on a polymer; and
    a passivation layer based on a hard dielectric between the conductive structure and the protection layer and between the edge termination structure and the protection layer.

13. The semiconductor device of claim 12, wherein an outer edge of the passivation layer is spaced apart from an outer edge of the edge termination structure.

14. The semiconductor device of claim 1, wherein the edge surface comprises a horizontal section parallel to the second surface, a vertical section connecting the horizontal section with the first surface and a vertical section connecting the horizontal section with the second surfaces and wherein an outer edge of the glass structure forms a continuous plane with an outer edge of the vertical sections connecting the horizontal section with the second surface.

15. The semiconductor device of claim 1, wherein
the glass structure is from soda-lime glass or silica containing at least one dopant selected from a group comprising boron, sodium, calcium, potassium, and aluminum.

\* \* \* \* \*

UNITED STATES PATENT AND TRADEMARK OFFICE
CERTIFICATE OF CORRECTION

Page 1 of 1

PATENT NO. : 9,570,542 B2
APPLICATION NO. : 14/242366
DATED : February 14, 2017
INVENTOR(S) : A. Breymesser et al.

It is certified that error appears in the above-identified patent and that said Letters Patent is hereby corrected as shown below:

In the Claims

At Column 14, Line 12 (Claim 1, Line 7), please insert --,-- after type.

Signed and Sealed this
Fifth Day of September, 2017

Joseph Matal
*Performing the Functions and Duties of the*
*Under Secretary of Commerce for Intellectual Property and*
*Director of the United States Patent and Trademark Office*